US008288234B2

(12) United States Patent
Seino et al.

(10) Patent No.: US 8,288,234 B2
(45) Date of Patent: Oct. 16, 2012

(54) METHOD OF MANUFACTURING HAFNIUM-CONTAINING AND SILICON-CONTAINING METAL OXYNITRIDE DIELECTRIC FILM

(75) Inventors: Takuya Seino, Kawasaki (JP); Takashi Nakagawa, Hachioji (JP); Naomu Kitano, Machida (JP); Toru Tatsumi, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 197 days.

(21) Appl. No.: 12/840,602

(22) Filed: Jul. 21, 2010

(65) Prior Publication Data
US 2011/0027979 A1 Feb. 3, 2011

(30) Foreign Application Priority Data

Jul. 28, 2009 (JP) ................. 2009-175092

(51) Int. Cl.
*H01L 21/336* (2006.01)
(52) U.S. Cl. .. 438/287; 438/591; 438/785; 257/E21.267
(58) Field of Classification Search ............ 257/E21.267
See application file for complete search history.

(56) References Cited

U.S. PATENT DOCUMENTS

| | | | | |
|---|---|---|---|---|
| 6,291,867 | B1 * | 9/2001 | Wallace et al. | 257/410 |
| 6,607,973 | B1 * | 8/2003 | Jeon | 438/591 |
| 7,655,549 | B2 * | 2/2010 | Sunil et al. | 438/591 |
| 7,679,148 | B2 | 3/2010 | Watanabe et al. | 257/411 |
| 2005/0139937 | A1 * | 6/2005 | Kamiyama et al. | 257/410 |
| 2005/0269651 | A1 * | 12/2005 | Chen et al. | 257/411 |
| 2006/0051506 | A1 * | 3/2006 | Senzaki et al. | 427/248.1 |
| 2006/0194396 | A1 | 8/2006 | Sunil et al. | |
| 2008/0264775 | A1 | 10/2008 | Kitano et al. | 204/192.1 |
| 2009/0170340 | A1 | 7/2009 | Kitagawa et al. | 438/766 |
| 2009/0170341 | A1 | 7/2009 | Kitano et al. | 438/770 |
| 2009/0170344 | A1 | 7/2009 | Fukuchi et al. | 438/785 |
| 2009/0298288 | A1 | 12/2009 | Seino et al. | 438/683 |
| 2010/0120238 | A1 | 5/2010 | Kitano et al. | 438/586 |
| 2010/0133092 | A1 | 6/2010 | Mashimo et al. | 204/192.21 |
| 2010/0221885 | A1 | 9/2010 | Kitano et al. | 438/287 |
| 2010/0244192 | A1 | 9/2010 | Nakagawa et al. | 257/532 |
| 2012/0068272 | A1 * | 3/2012 | Ahn et al. | 257/369 |

FOREIGN PATENT DOCUMENTS

JP   4239015   3/2009

OTHER PUBLICATIONS

Chinese Office Action dated Mar. 7, 2012, issued in corresponding CN Application No. 201010240749.5, and English Translation.

* cited by examiner

*Primary Examiner* — Stephen W Smoot
(74) *Attorney, Agent, or Firm* — Fitzpatrick, Cella, Harper & Scinto

(57) ABSTRACT

To provide a method of manufacturing a dielectric film having a high dielectric constant. In an embodiment of the present invention, an HfN/Hf laminated film is formed on a substrate on which a thin silicon oxide film is formed and a dielectric film of a metal nitride made of a mixture of Hf, Si, O and N is manufactured by annealing treatment. According to the present invention, it is possible to (1) reduce an EOT, (2) reduce a leak current to $Jg=1.0\times10^{-1}$ $A/cm^2$ or less, (3) suppress hysteresis caused by the generation of fixed charges, and (4) prevent an increase in EOT even if heat treatment at 700° C. or more is performed and obtain excellent heat resistance.

21 Claims, 16 Drawing Sheets

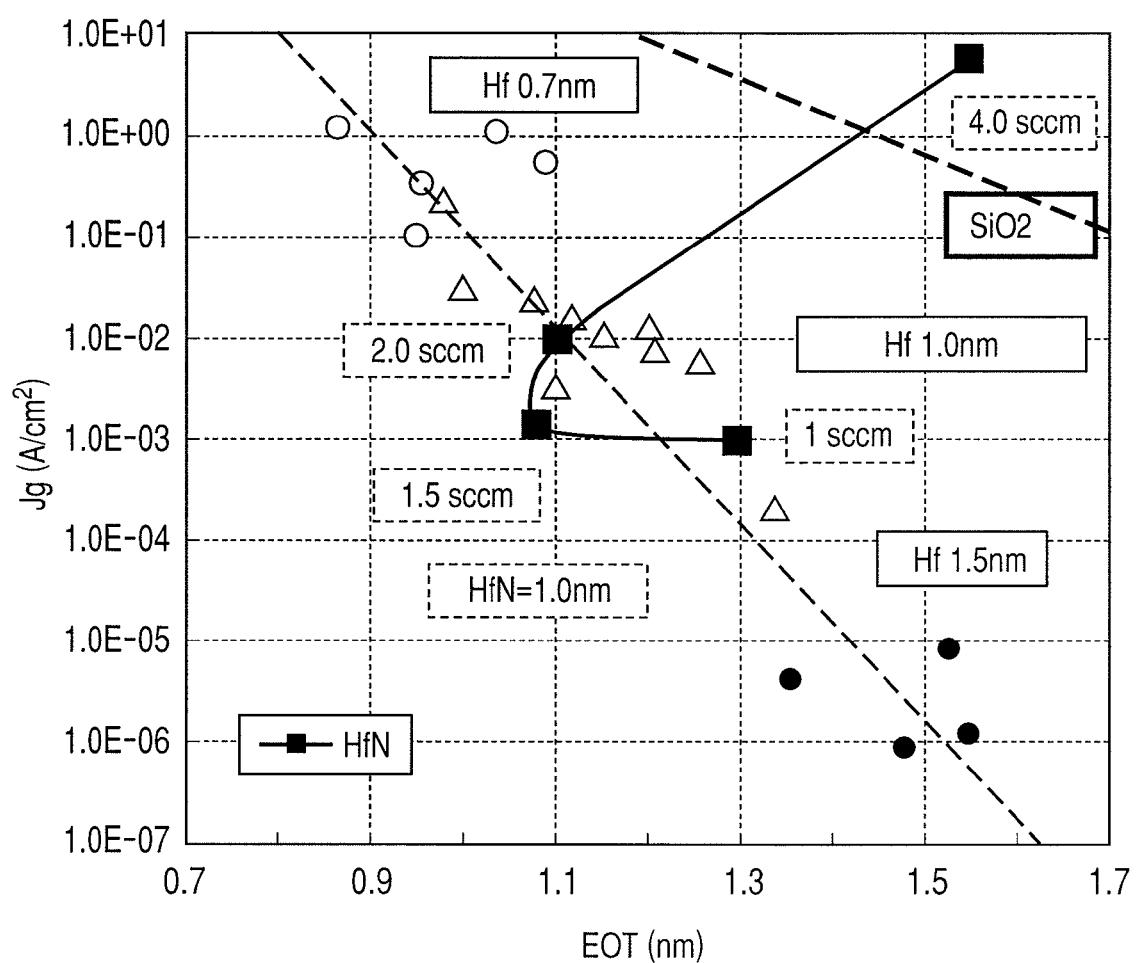

METHOD OF MANUFACTURING HAFNIUM-CONTAINING AND SILICON-CONTAINING METAL OXYNITRIDE DIELECTRIC FILM

CROSS-REFERENCE TO RELATED APPLICATION

This application claims the benefit of Japanese Patent Application No. 2009-175092, filed on Jul. 28, 2009. The content of the aforementioned application is incorporated herein by reference in its entirety.

BACKGROUND OF THE INVENTION

1. Field of the Invention

The present invention relates to a dielectric film and a method of manufacturing a semiconductor device using a dielectric film.

2. Description of the Related Art

A gate insulating film of a MOSFET constituting a semiconductor integrated circuit is being reduced in size and thickness recently, and when an $SiO_2$ film is used as a gate insulating film, a tunnel current is produced if its film thickness is 2 nm or less, which is a value demanded recently, and a gate leak current increases. Hence, in recent years, it has been examined to replace the gate insulating film material with a high dielectric constant material having a higher relative permittivity than that of an $SiO_2$ film. This method enables the reduction in $SiO_2$ equivalent oxide thickness (EOT) even when the actual film thickness of an insulating film is increased. The EOT required by a recent MOSFET having a gate length of 22 nm or less is demanded to be further reduced, and in order to meet this demand, it is necessary to increase the actual film thickness of an insulating film using a high dielectric constant material and reduce the gate leak current. As one of the methods of increasing the relative permittivity higher than that of an $SiO_2$ film, it has been examined to turn an $SiO_2$ film into an $Si_3N_4$ film or into an SiON film by turning $SiO_2$ into a plasma nitride, however, the relative permittivity of $Si_3N_4$ is about twice that of $SiO_2$, and therefore, it is not possible to reduce the EOT sufficiently. Hence, an Hf based oxide or Hf based nitride is examined as a high dielectric constant material.

As a method of forming a high dielectric constant film, the CVD (Chemical Vapor Deposition) method, the atomic layer adsorption/deposition method, and the sputter method are cited. The CVD method has problems of the controllability of film thickness, the uniformity, and the reproducibility because of an incubation time in the forming process.

As one of measures to solve these problems, a method of forming a high-k dielectric film using the sputtering method excellent in the controllability of film thickness, the uniformity, and the reproducibility has been proposed.

The specification of Japanese Patent No. 4239015 describes a method capable of suppressing the interface defect and reducing the thickness of an oxide film to 0.6 nm by diffusing a high dielectric constant film in the oxide film by heat treatment at 500° C. to 700° C. after forming the high dielectric constant film on a silicon oxide film and of reducing the EOT by increasing the relative permittivity of an insulating film. This method requires a technique to leave a silicon oxide film evenly in a region where the physical film thickness is 1.0 nm or less and it is important to prevent a high dielectric constant film to be formed thereon from diffusing to the interface between $SiO_2$ and silicon by anneal. A method of forming an oxynitride film, which is a silicon oxide film into which a trace of nitrogen, about a few percents of nitrogen, is introduced, by a radical nitriding process is also described. Further, it is also described that the heat resistance can be improved by 50° C. and the hysteresis can be reduced more than when Hf is formed on a silicon oxide film by depositing HfN on the silicon oxide film to a thickness of 0.6 nm to 1.0 nm by the sputtering that has introduced nitrogen and performing heat treatment.

The reduction in EOT and the increase in leak current are in a relationship of tradeoff, and therefore, the leak current cannot be improved by only reducing the EOT. Therefore, an insulating film forming technique excellent in heat resistance without changing the composition or crystallinity even when heat treatment at 800° C. or more is performed and without increasing the EOT or the leak current is required. If fixed charges are present in an insulating film, hysteresis occurs in the C-V curve and the fixed charges are known to reduce the lifetime of an insulating film and degrade the reliability of a semiconductor device, and therefore, an insulating film forming technique to suppress fixed charges is also required.

However, the respective techniques described above have the following problems.

The technique to form HfSiO by depositing Hf on a silicon oxide film and performing vacuum anneal in an oxygen atmosphere as described in the specification of Japanese Patent No. 4239015 has such a problem that when the thickness of a silicon oxide film is reduced to 1.0 nm or less, Hf diffused in the silicon oxide film in the heat treatment step reaches the silicon substrate interface to produce fixed charges and deteriorate the electric characteristics. Further, the temperature at which Hf is diffused in the silicon oxide film described in the specification of Japanese Patent No. 4239015 is as low as 500° C. to 600° C. and there is no description of the heat resistance in the activation step (1,000° C.) in the CMOS manufacturing step.

Furthermore, the method of forming an oxynitride film, which is a silicon oxide film having a trace of nitrogen, a few percents of nitrogen, introduced therein, by the radical nitriding process, as described in the specification of Japanese Patent No. 4239015 has such a problem that when the silicon oxide film having a thickness of 1.0 nm or less is radical-nitrided, nitrogen and silicon reach the silicon oxide film interface to deteriorate the interface characteristics

SUMMARY OF THE INVENTION

An object of the present invention is to provide a method of manufacturing a dielectric film capable of reducing the EOT and the leak current and of forming a dielectric film excellent in heat resistance and in which hysteresis by the generation of fixed charges is suppressed.

The inventors of the present invention have assiduously studied to solve the above-mentioned problems and as a result, found that a dielectric film capable of reducing the leak current and improving the EOT can be obtained by forming a very thin silicon oxide film on a to-be-treated substrate by heating, further forming a metal nitride having a specific composition on the silicon oxide film, successively forming a metal film on the metal nitride, and still further performing anneal treatment, resulting in the completion of the present invention.

An aspect of the present invention is a method of manufacturing a dielectric film characterized by comprising a first step of preparing a to-be-treated substrate on which a silicon oxide film is formed; a second step of depositing a metal nitride film containing Hf and N on the silicon oxide film; a third step of depositing a metal film containing Hf on the metal nitride film; and a fourth step of performing a heat treatment on a laminated film of the silicon oxide film, the metal nitride film, and the metal film to form a metal oxynitride containing Hf, Si, O and N.

With such a configuration, by the heat treatment in the fourth step, HfN in the lower layer silicate-reacts with the silicon oxide film, and thus, the film thickness of $SiO_2$ can be reduced and at the same time, $SiO_2$ is nitrided and the permittivity can be increased. Further, by the heat treatment in the fourth step, Hf in the upper layer forms HfO having a high permittivity and the permittivity of the dielectric film can be further increased. Hence, the EOT can be reduced, the leak current is reduced, and the hysteresis caused by the generation of fixed charges is suppressed, and a dielectric film excellent in heat resistance without increasing the EOT even when heat treatment at 700° C. is performed is obtained.

According to the present invention, by forming a dielectric film containing Hf, Si, O and N from a dielectric film having a very thin silicon oxide film and in which a metal oxynitride film having a desired nitrogen concentration and a metal film are laminated successively, by vacuum anneal treatment, it is possible to (1) reduce the EOT, (2) reduce the leak current to $Jg=1.0\times10^{-1}$ $A/cm^2$ or less, (3) reduce hysteresis caused by the generation of fixed charges, and (4) obtain a dielectric film excellent in heat resistance that an increase of the EOT is reduced even if heat treatment at 700° C. or more is performed. Therefore, even when the method of manufacturing a dielectric film of the present invention is applied to the method of manufacturing a gate insulating film of a CMOS transistor device having a high-temperature anneal treatment step, the equivalent oxide thickness (EOT) due to an increase in permittivity can be reduced, the leak current and fixed charges can be reduced, and the heat resistance can be improved.

BRIEF DESCRIPTION OF THE DRAWINGS

FIG. 7 is a diagram illustrating the dependence of the EOT and the leak current (Jg) on the feed rate of nitrogen in a deposition step of an HfN film according to an embodiment of the present invention.

DETAILED DESCRIPTION OF THE INVENTION

Embodiments of the present invention will now be described in detail according to the accompanying drawings.

The inventors of the present invention have assiduously studied to solve the above-mentioned problems, and as a result, found that a dielectric film capable of reducing the leak current even in a region where EOT=1.5 nm or less, suppressing hysteresis caused by the generation of fixed charges, and suppressing the EOT from increasing even when heat treatment at 700° C. or more is performed, and excellent in heat resistance can be obtained by forming a very thin silicon oxide under film by performing heat treatment on a silicon substrate, further forming a metal nitride having a specific composition on the silicon oxide under film, further forming a metal film on the metal nitride successively, and still further performing heat treatment in a vacuum.

A dielectric film formed in an embodiment of the present invention will be described by way of an example of a MIS (Metal Insulator Semiconductor) capacitor, in which a very thin silicon oxide under film is formed on a substrate, HfN and Hf are laminated on the silicon oxide under film, and a metal oxynitride is formed by performing heat treatment on the laminated metal.

Figure 1:
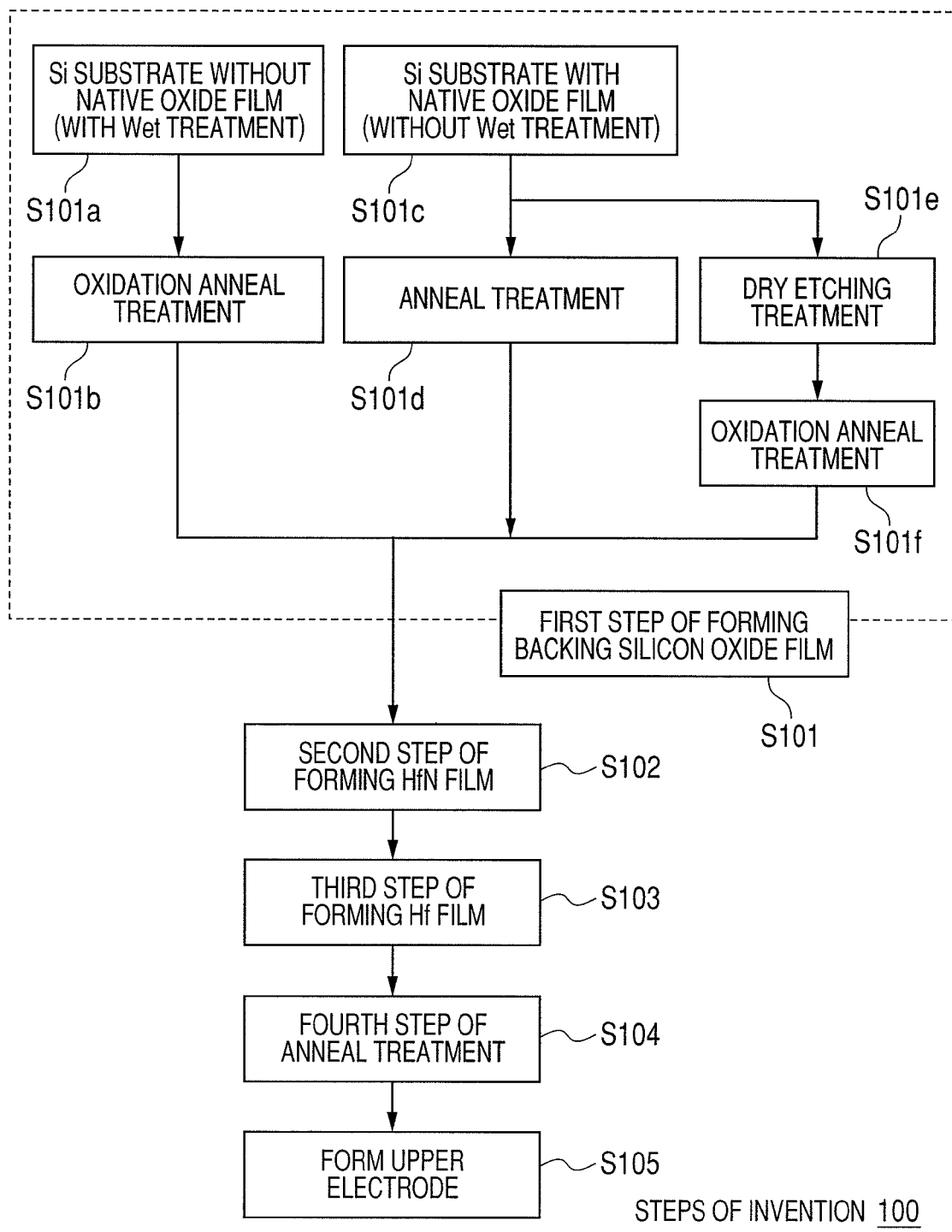
FIG. 1 is a process chart of a method of manufacturing a dielectric film according to an embodiment of the present invention.
Figure 2:
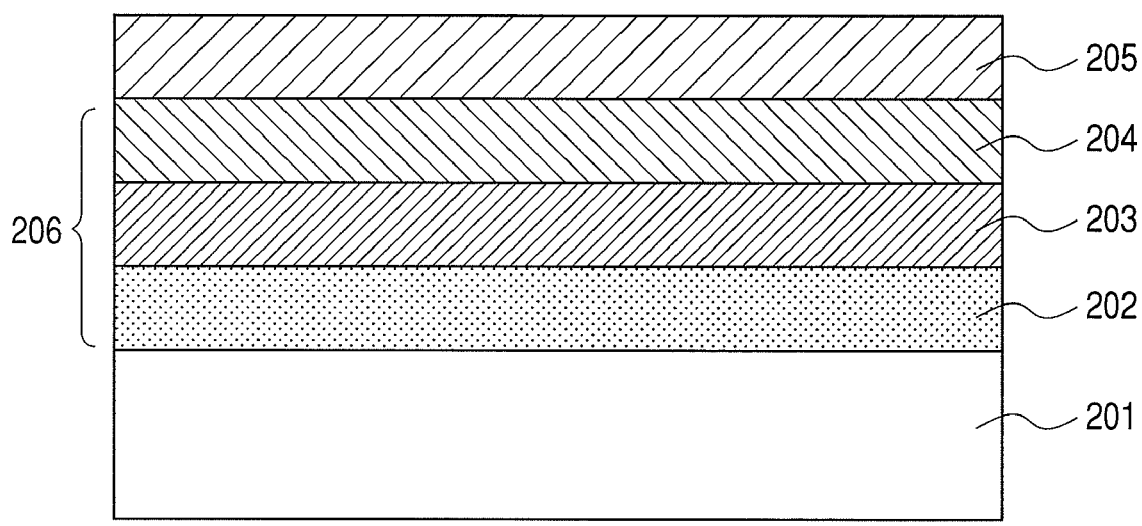
FIG. 2 is a section view of a MIS capacitor in which a dielectric film is formed by a method of manufacturing a dielectric film according to an embodiment of the present invention.

FIG. 1 illustrates steps of a method of manufacturing a dielectric film according to an embodiment of the present invention and FIG. 2 illustrates a section view of a MIS capacitor according to an embodiment of the present invention.

In a first step S101, a silicon oxide under film is formed on a substrate by predetermined heating treatment. In the present embodiment, for example, a manufacturing method illustrated in FIG. 1 can be started from one of a step S101*a* and a step S101*c*.

In the present embodiment, when a silicon native oxide film is removed from a silicon substrate 201, the silicon native oxide film is removed by performing Wet treatment on the silicon substrate 201 using a DHF (Diluted Hydrofluoric Acid) in the step S101*a*, and in a step S101*b*, a heat treatment is performed in an oxygen atmosphere on the silicon substrate 201 from which the silicon native oxide film is removed, to form a silicon oxide film (silicon oxide under film) 202 on the silicon substrate 201.

When the silicon substrate 201 with a native oxide film is used, in the step S101*c*, the silicon substrate 201 on which a silicon native oxide film is left over without the above-mentioned Wet treatment is prepared. Next, in a step S101*d*, a heat treatment is performed on the silicon substrate 201 to form the silicon oxide film (silicon oxide under film) 202 on the silicon substrate 201. Alternatively, in a step S101*e*, after performing dry etching on the silicon substrate 201 having a silicon native oxide film without the Wet treatment, a heat treatment is performed on the silicon substrate 201 after the dry etching in an oxygen atmosphere in a step S101*f* to form the silicon oxide film (silicon oxide under film) 202 on the silicon substrate 201.

Figure 3:
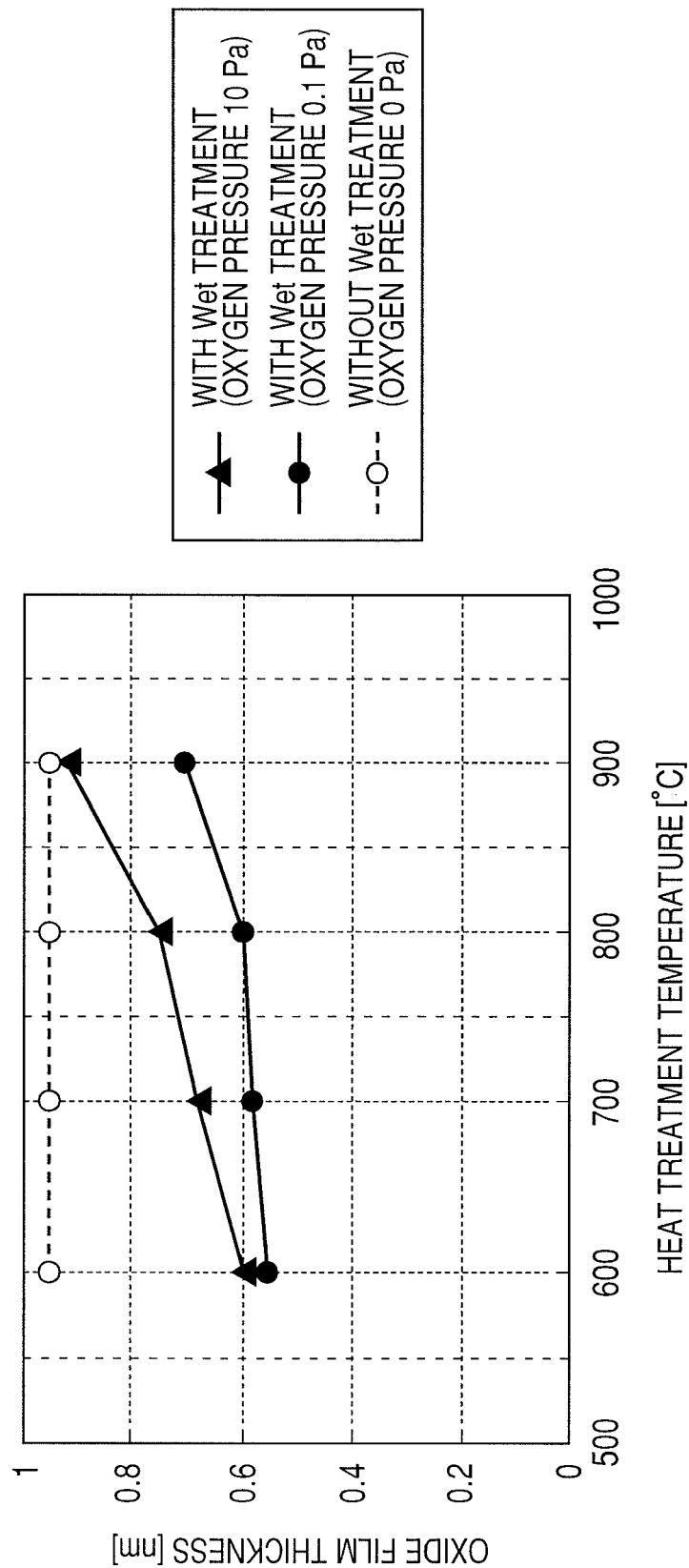
FIG. 3 is a diagram illustrating the dependence of the thickness of an oxide film on the oxidation temperature when a silicon oxide under layer is formed by the first step illustrated in FIG. 1.

As illustrated in FIG. 3, when a native oxide film is removed by the Wet treatment, the thickness of an oxide film can be controlled in the range of 0.5 nm to 1.0 nm by varying the anneal oxidation temperature and the oxygen pressure and when the native oxide film is not removed, the thickness of an oxide film does not depend on the heat treatment temperature, however, a very thin oxide film having a thickness of 1.0 nm or less can be formed. Even when the silicon native oxide film is removed by dry etching and the silicon oxide under film is formed by performing heat treatment in an oxygen atmosphere, the same thickness of an oxide film as the thickness when the native oxide film is removed by the Wet treatment can be achieved.

Next, after the Wet treatment as the first step S101, in a second step S102, a metal nitride film made of HfN (HfN film) 203 is deposited to a film thickness in the range of, for example, 0.3 to 0.7 nm on the substrate 201 having the silicon oxide film 202 having a film thickness of 1.0 nm or less using the silicon oxide film 202 thermally oxidized in the first step S101. Subsequently, in a third step S103, by depositing a metal film made of Hf (Hf film) 204 to a film thickness in the range of, for example, 0.1 to 0.7 nm on the metal nitride film 203, a laminated film of HfN/Hf is formed. As a comparative example, a single layer film of HfN and Hf is deposited.

In the embodiment illustrated in FIG. 1, in the first step S101, the silicon oxide film 202 is formed on the substrate 201 in any of the steps 101*a* to 101*f*, however, in the present invention, it is important to form a dielectric film 206 in the second step S102, the third step S103, and a fourth step S104, as will be described later. Hence, it is essential to perform the second step S102 to the fourth step S104 for the substrate 201 on which the silicon oxide film 202 is formed rather than forming the silicon oxide film 202 on the substrate 201. Consequently, it may also be possible to form a silicon oxide film on a substrate in advance, preserve the substrate, and then use the preserved substrate with a silicon oxide film. Alternatively, it may also be possible to form a silicon oxide film by, for example, the CVD method. That is, in the first step S101, any of the aspects may be used as long as the substrate 201 on which the silicon oxide film 202 is formed can be prepared.

Figure 4:
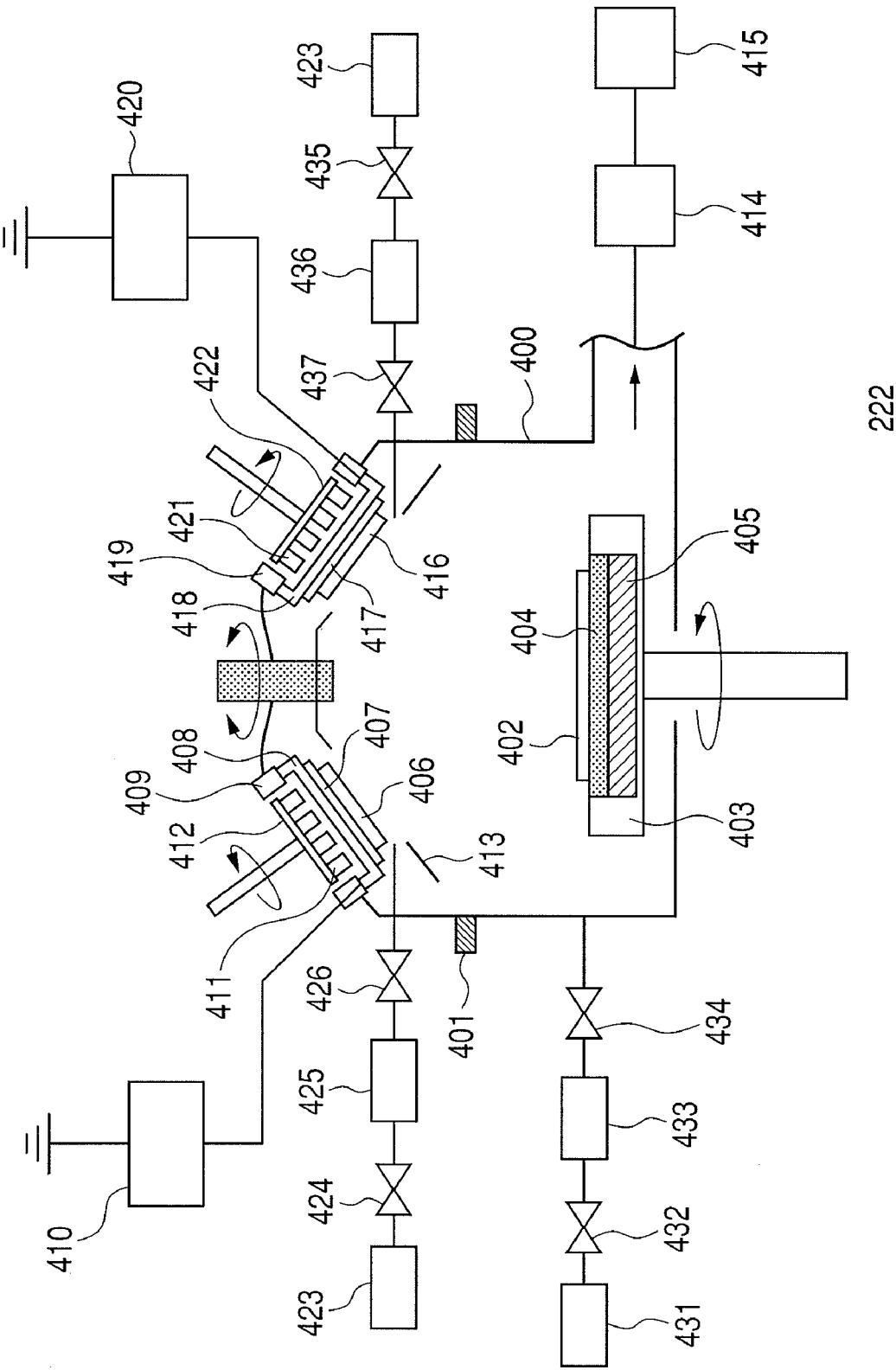
FIG. 4 is a diagram illustrating an outline of an example of a processing device used in a step of laminating a metal nitride film and a metal film and forming an electrode according to an embodiment of the present invention.

FIG. 4 illustrates an outline of an example of a processing device used in the deposition step of the metal nitride film 203 made of HfN and the metal film 204 made of Hf in the second step S102 and the third step S103.

A film formation treatment chamber 400 is configured to be heated to a predetermined temperature by a heater 401. The film formation treatment chamber 400 is configured so that a to-be-treated substrate 402 can be heated to a predetermined temperature by a heater 405 via a susceptor 404 incorporated in a substrate support base 403. It is desirable for the substrate support base 403 to be capable of rotating at a predetermined rotational speed from the viewpoint of the evenness of film thickness. In the film formation treatment chamber 400, targets 406, 416 are installed at positions facing the to-be-treated substrate 402.

The targets 406, 416 are installed on target holders 408, 418 via back plates 407, 417 made of metal, such as Cu. It is also possible to manufacture the outline shape of a target assembly in which the targets 406, 416 and the back plates 407, 417 are combined as a single part by a target material and attach this part as a target. That is, the construction may be one in which the target is installed on the target holder.

The target holders 408, 418 made of metal, such as Cu, have direct current power sources 410, 420 connected thereto that apply power for sputter discharge, and function as a cathode. Further, the target holders 408, 418 are attached to the inner wall of the film formation treatment chamber 400 via insulators 409, 419 and thereby insulated from the wall of the film formation treatment chamber 400 at the ground potential. When viewed from the sputter surface, magnets 411, 421 to realize magnetron sputtering are arranged behind the targets 406, 416. The magnets 411, 421 are held by magnet holders 412, 422 and can be rotated by a magnet holder rotating mechanism, not shown schematically. In order to make even the erosion of the target, the magnets 411, 421 keep rotating during the period of discharge.

The targets 406, 416 are installed at the offset positions obliquely above the substrate 402. That is, the center points of the sputter surface of the targets 406, 416 are located at positions a predetermined dimension shifted from the normal at the center of the to-be-treated substrate 402.

Between the targets 406, 416 and the to-be-treated substrate 402, a shield plate 413 is installed, which controls film formation onto the to-be-treated substrate 402 by sputter particles discharged from the targets 406, 416 provided with power.

In the present embodiment, as a target, the metal targets 406, 416 made of Hf are used. A dielectric film is deposited by the provision of power from one of the direct current power sources 410 and 420 to one of the metal targets 406 and 416 via one of the target holders 408 and 418 and one of the back plates 407 and 417. At this time, an inert gas is introduced from an inert gas source 423 into the film formation treatment chamber 400 through the vicinity of the target via one of valves 424 and 435, one of mass flow controllers 425 and 436 to adjust the flow rate of a gas to be introduced, and one of valves 426 and 437. Nitrogen as a reactive gas is introduced from a reactive gas source (nitrogen gas source) 431 to the vicinity of the substrate in the film formation treatment chamber 400 via a valve 432, a mass flow controller 433, and a valve 434. The introduced inert gas and reactive gas are discharged by an exhaust pump 415 via a conductance valve 414.

The deposition, that is, film formation of HfN in the second step S102 may be performed by setting the substrate temperature to 30° C. and the target power of Hf to 100 W, using Ar as an inert gas, setting the feed rate of Ar to 50 sccm, and setting the feed rate of nitrogen, a reactive gas, to a range of 1.0 sccm to 10 sccm. Next, the deposition of Hf in the third step S103 may be performed by setting the substrate temperature to 30° C. and the target power of Hf to 100 W, using Ar as an inert gas, and setting the feed rate of Ar to 50 sccm.

It is desirable for the pressures in the vacuum vessel in the second step S102 and the third step S103 to be $1 \times 10^{-1}$ Pa or less from the viewpoint of the uniformity.

When the second step S102 and the third step S103 are performed using different vacuum vessels, it is desirable for a substrate to be transferred via a vacuum transfer vessel in order to prevent the electric characteristic from degrading due to carbon contamination accompanying the exposure to the atmosphere. Further, from the viewpoint of throughput, it is desirable for the second step S102 and the third step S103 to be performed in one and the same vacuum vessel.

Figure 5:
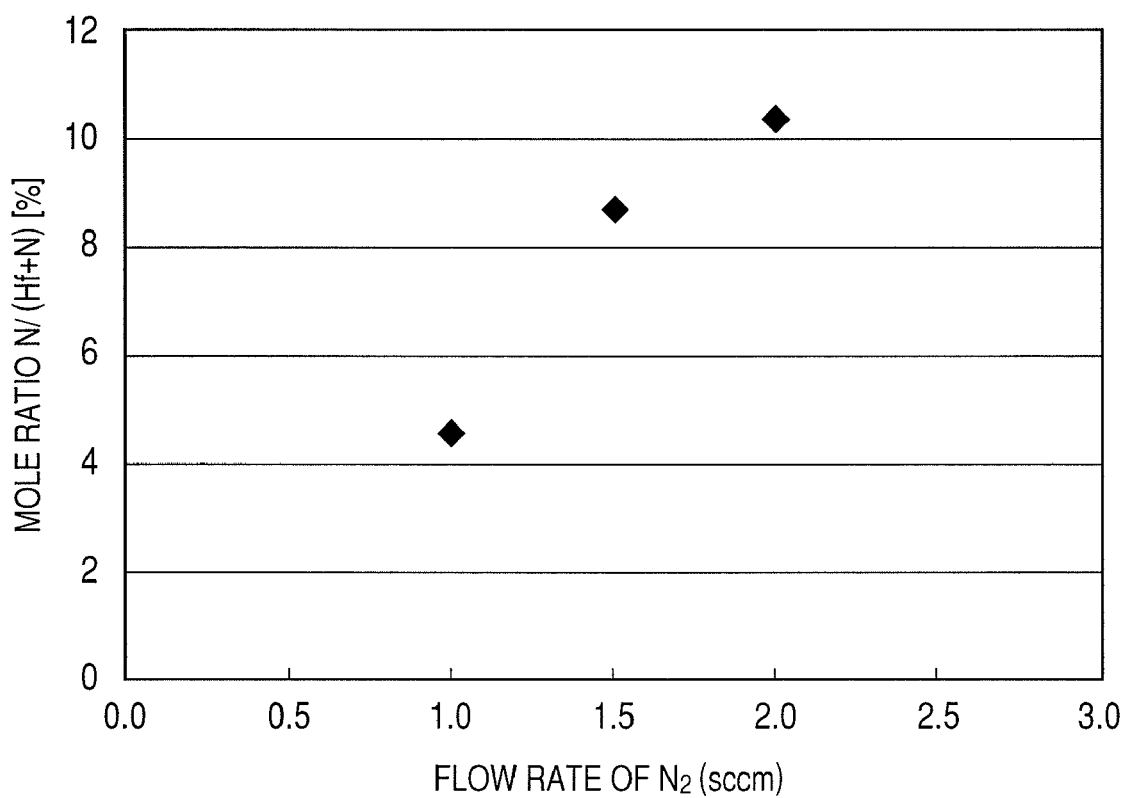
FIG. 5 is a diagram illustrating a relationship between the mole ratio of nitrogen contained in an HfN film and the feed rate of nitrogen in a deposition step according to an embodiment of the present invention.

At this time, the composition of the HfN film can be adjusted by the feed rate of nitrogen. FIG. 5 illustrates the dependence of the composition of the HfN film on the flow rate of nitrogen. The composition is evaluated by the analysis using the XPS (X-ray Photoelectron Spectroscopy). As described above, by adjusting the flow rate of nitrogen in the range of 1.0 sccm to 2.0 sccm, it can be confirmed that the mole ratio N/(Hf+N) can be controlled to within the range of 0.04 to 0.11.

Figure 6:
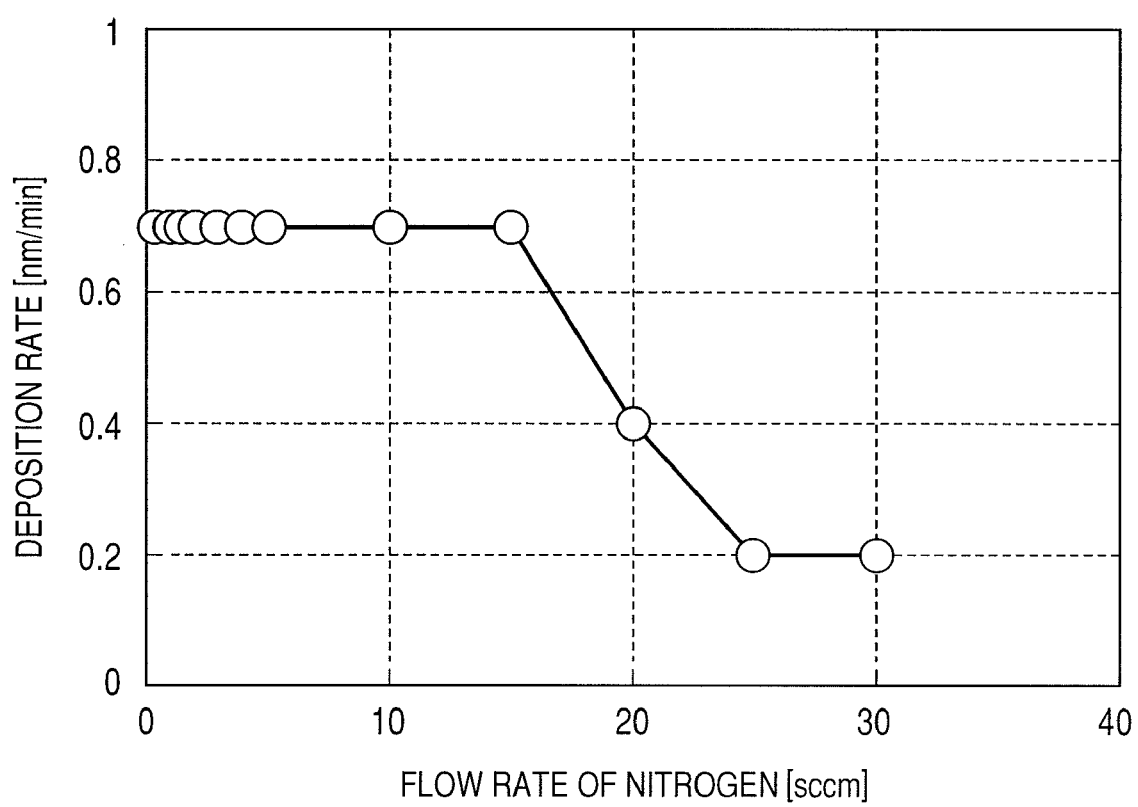
FIG. 6 is a diagram illustrating a relationship between the deposition rate and the feed rate of nitrogen in a deposition step of an HfN film according to an embodiment of the present invention.

FIG. 6 illustrates the dependence of the deposition rate of the HfN film on the flow rate of nitrogen. From FIG. 6, it can be confirmed that the deposition rate increases considerably to 0.7 nm/min or more in a region where the flow rate of nitrogen is lower than 15 sccm while the deposition rate is 0.4 nm/min or less in a region where the flow rate of nitrogen is 15 sccm or more. This is because the metal target surface is nitrided and the sputter rate is reduced when the feed rate of nitrogen is 15 sccm or more. Consequently, in the present embodiment, it is demonstrated that the formation of a dielectric film can be realized without causing the deposition rate to degrade.

Next, in the fourth step S104, the dielectric film 206 made of a metal nitride film containing Hf, Si, O and N is formed by performing a heat treatment on a laminated film of the silicon oxide film 202, the metal nitride film (HfN) 203, and the metal film (Hf) in the temperature range of 700° C. to 950° C. in an oxygen atmosphere. The similar heat treatment is performed also on the single layer film of Hf and HfN as a comparative example to form a dielectric film made of a metal nitride film containing Hf, Si, O and N.

Next, in a fifth step S105, on the dielectric film 206, an Au film having a desired size is vapor-deposited to a thickness of 100 nm as an upper electrode 205 by the vacuum deposition method and thus a MIS capacitor structure is formed. Next, the electric characteristics are measured with the silicon substrate 201 as a lower electrode and the Au film as the upper electrode 205. As the electric characteristics, the EOT of the element is measured by the C-V measurement and the leak current is measured by the I-V characteristic.

Here, the EOT (Equivalent Oxide Thickness) is described. An electric film thickness of an insulating film obtained by inversely calculating from the capacity on the assumption that the insulating film material is a silicon oxide film regardless of the kind of insulating film is called an equivalent oxide thickness. That is, when the relative permittivity of an insulating film is $\in h$, the relative permittivity of a silicon oxide film is $\in o$, and the thickness of the insulating film is dh, an equivalent oxide thickness de is expressed by the following expression (1).

$$de = dh \times (\in o / \in h) \quad (1)$$

The above-mentioned expression (1) indicates that when a material having the relative permittivity $\in h$ greater than the relative permittivity $\in o$ of the silicon oxide film is used as an insulating film, the equivalent oxide thickness de is the same as that of the silicon oxide film thinner than the film thickness $\in h$ of the insulating film. The relative permittivity $\in o$ of the silicon oxide film is about 3.9. Hence, for example, the equivalent oxide thickness (electric film thickness) de of a film made of a material having a high-k relative permittivity of $\in h=39$ is 1.5 nm even when the physical film thickness dh is 15 nm, and therefore, it is possible to considerably reduce the tunnel current while keeping the capacitance value of the insulating film equivalent to the capacitance value of a silicon oxide film having a film thickness of 1.5 nm.

In view of the influence of the surface potential due to the difference in film thickness and film quality of a dielectric film on the I-V characteristic, the leak current value is evaluated by measuring a leak current when applying a voltage of (Vfb-1) V, where Vfb is a flat band voltage obtained by the C-V characteristic of the MIS structure, to the upper electrode.

First, the electric characteristics of a sample (the electric characteristics of the comparative example), in which a single layer film of Hf and HfN is deposited on a silicon oxide film and subjected to a heat treatment are described. FIG. 7 illustrates a relationship between the EOT and the leak current value Jg of the sample, which is an HfN film having a film thickness of 1.0 nm and subjected to a heat treatment at 900° C. (■ marks in the figure). Here, the mole ratio N/(Hf+N) of HfN film is varied in the range from 0.04 (when the condition of the flow rate of $N_2$ is 1.0 sccm) to 0.14 (when the condition of the flow rate of $N_2$ is 4.0 sccm). For comparison, a relationship between the EOT and the leak current value Jg of the sample is illustrated in the figure, which is an Hf film the film thickness of which is varied in the range of 0.7 to 1.5 nm and which is subjected to a heat treatment at 750° C. Here, the thickness of the Hf film with a ○ mark is 0.7 nm, the thickness of the Hf film with a △ mark is 1.0 nm, and the thickness of the Hf film with a ● mark is 1.5 nm. A thick broken line indicates a relationship between the EOT and the leak current when the thickness of the $SiO_2$ single layer film is reduced and a thin broken line indicates a relationship between the EOT and the leak current when the thickness of the Hf film is varied in the range of 0.7 to 1.5 nm.

From FIG. 7, it can be confirmed that the reduction in EOT can be realized in the HfN film compared to the Hf film not containing nitrogen and the EOT is the smallest when the flow rate of nitrogen=1.5 sccm and the mole ratio N/(Hf+N)=0.09. The reason for this can be thought that nitrogen in HfN is diffused in the silicon oxide film and SiON and HfON are formed, and therefore, the permittivity is improved and the EOT is reduced. Further, when the flow rate of nitrogen=4.0 sccm and the mole ratio N/(Hf+N)=0.14, the EOT and the leak current are remarkably large. When the mole ratio N/(Hf+N) exceeds 0.11, the EOT and the leak current become remarkably large. The reason for this can be thought that when the concentration of nitrogen increases, the number of nitrogen atoms not bonded with Hf increases, and therefore, the leak current increases and the dielectric constant decreases. As will be described later, in the case of HfN, an increase in EOT is not observed even when the heat treatment at 900° C. is performed, however, in the case of Hf, an increase in EOT is observed at heat treatment temperatures of 850° C. or more.

Figure 8A:
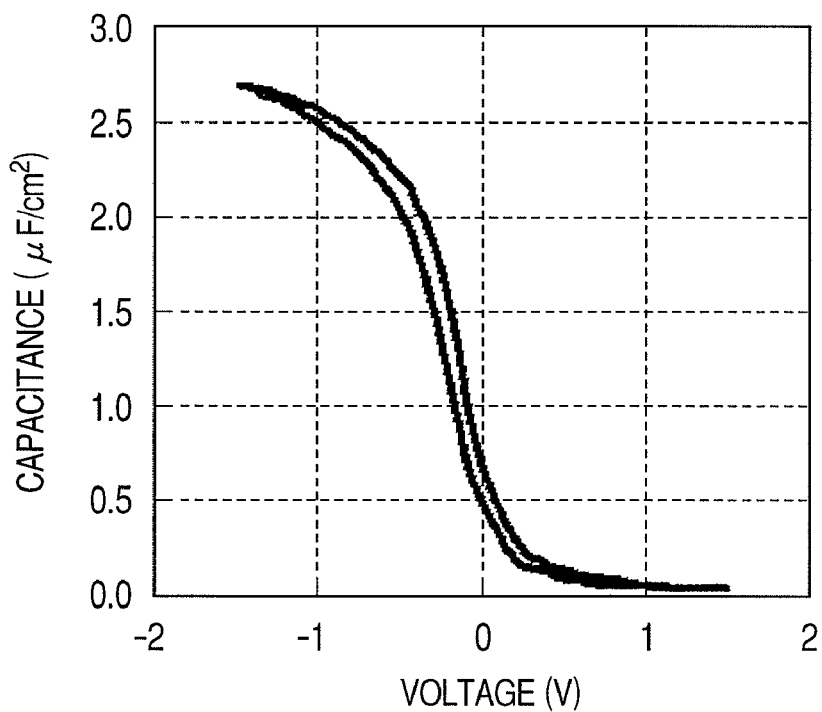
FIG. 8A is a diagram illustrating a C-V curve of a dielectric film when a heat treatment at 750° C. is performed on an Hf single layer film according to an embodiment of the present invention.
Figure 8B:
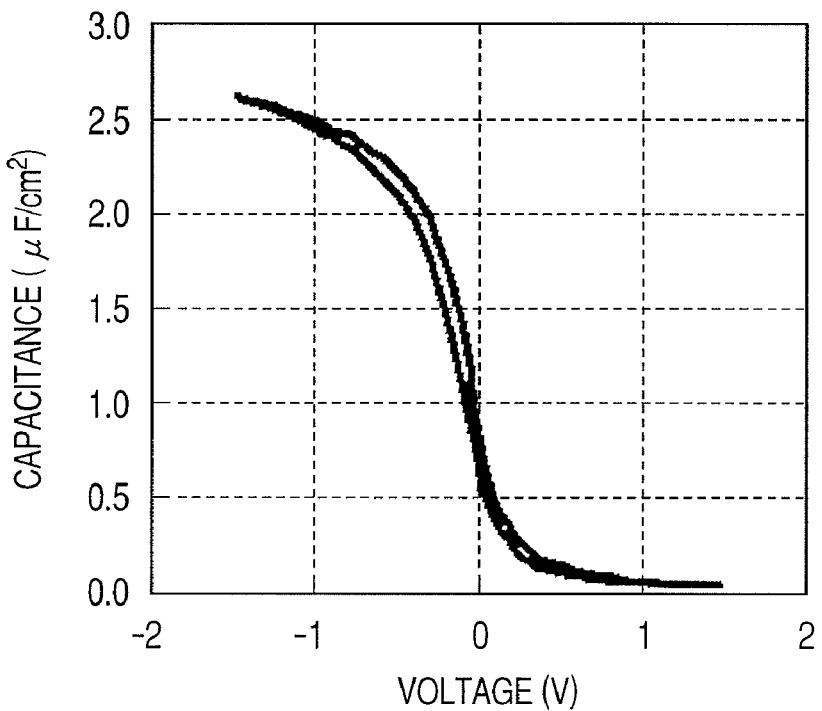
FIG. 8B is a diagram illustrating a C-V curve of a dielectric film when a heat treatment at 900° C. is performed on an HfN single layer film according to an embodiment of the present invention.

FIG. 8A illustrates the C-V characteristic of a sample, which is a single layer film of Hf having a film thickness of 1.0 nm and subjected to the heat treatment at 750° C. and FIG. 8B illustrates the C-V characteristic of a sample, which is the single layer film of HfN having a film thickness of 1.0 nm and a mole ratio of 0.09 and subjected to the heat treatment at 900° C. From these figures, it can be confirmed that while Hf has a hysteresis of 100 mV, HfN has a hysteresis of 50 mV, reduced in hysteresis shift.

Figure 9:
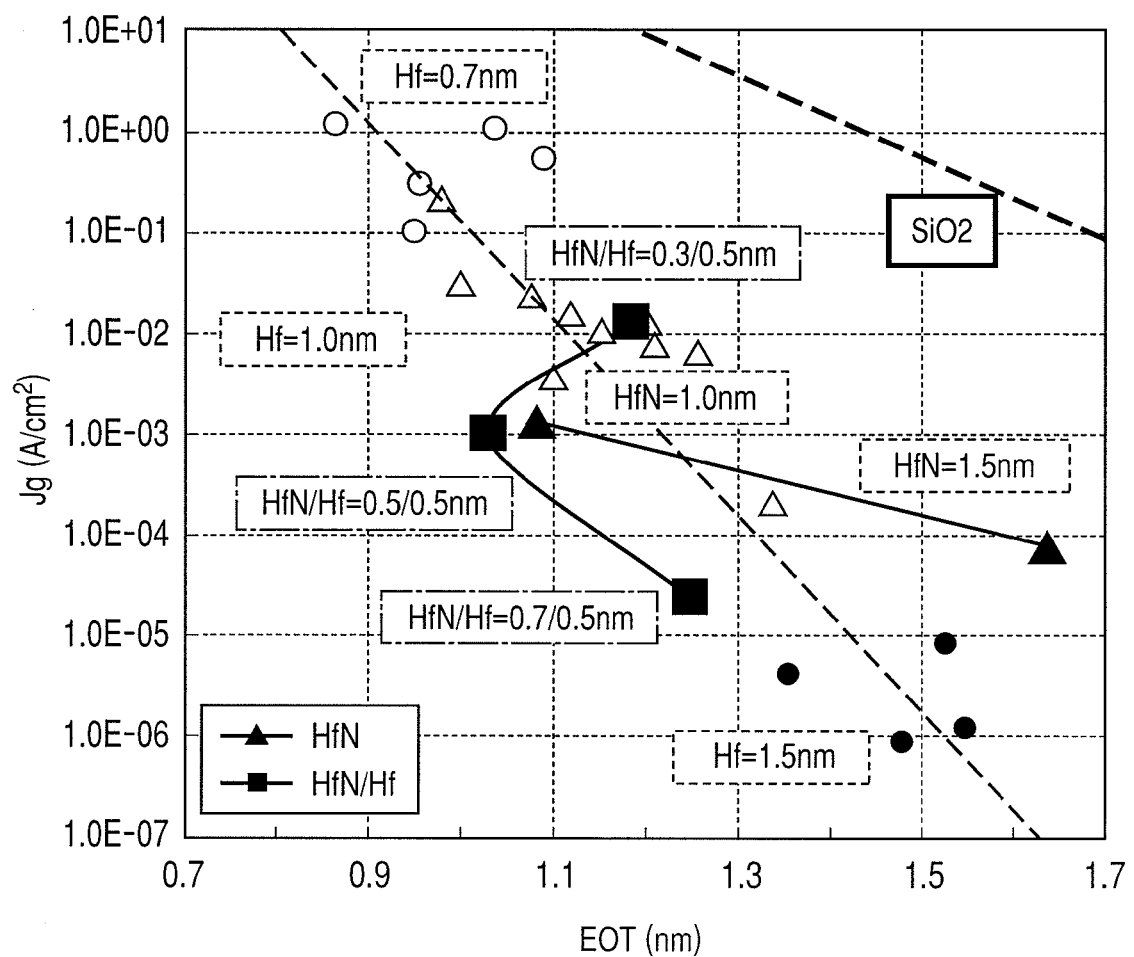
FIG. 9 is a diagram illustrating the dependence of the EOT and the leak current (Jg) of a dielectric film on the thickness of an HfN film according to an embodiment of the present invention.

Next, the HfN/Hf lamination structure in the present embodiment will be described. A relationship between the EOT and the leak current of a sample is illustrated in FIG. 9 (▲ marks in FIG. 9), in which the flow rate of nitrogen is set to 1.5 sccm, the optimum flow rate of nitrogen obtained from FIG. 7 and the mole ratio N/(Hf+N) of the HfN film is set to 0.09 and then the film thickness of the HfN single layer film is varied in the range of 1.0 to 1.5 nm. Further, a relationship between the EOT and the leak current of a sample is illustrated in FIG. 9 (■ marks in FIG. 9), in which the thickness of an Hf film of the HfN/Hf laminated film is fixed to 0.5 nm and the thickness of an HfN film is varied in the range of 0.3 nm to 0.7 nm.

From FIG. 9, it can be observed that the EOT and the leak current of the HfN/Hf laminated film are more improved in the range of 0.5 nm to 0.7 nm of the thickness of the HfN film compared to the HfN film in which Hf is not laminated. The reason for this can be thought that if Hf is laminated further on HfN, the Hf layer is oxidized in heat treatment and the concentration of oxygen in the insulating film increases compared to the case of the HfN single layer, and therefore, the permittivity is improved and at the same time, the leak current is improved. It is also demonstrated that the EOT can be reduced stably by employing the HfN/Hf laminated film. Further, it can be thought that by optimizing the HfN film thickness, a laminated film of SiON and HfON is formed, in which the concentration of nitrogen diffused from the HfN film to the silicon oxide film is optimized, and thereby, the dielectric constant is improved and the EOT is reduced.

From the above results, it is recommended to set the thickness of the HfN film to the range from 0.3 nm to 0.7 nm inclusive and the mole ratio N/(Hf+N) of HfN to the range from 0.04 to 0.11 inclusive in order to realize EOT=1.5 nm or less in the step of forming a dielectric film using the laminated film of HfN and Hf in the present embodiment.

Figure 10:
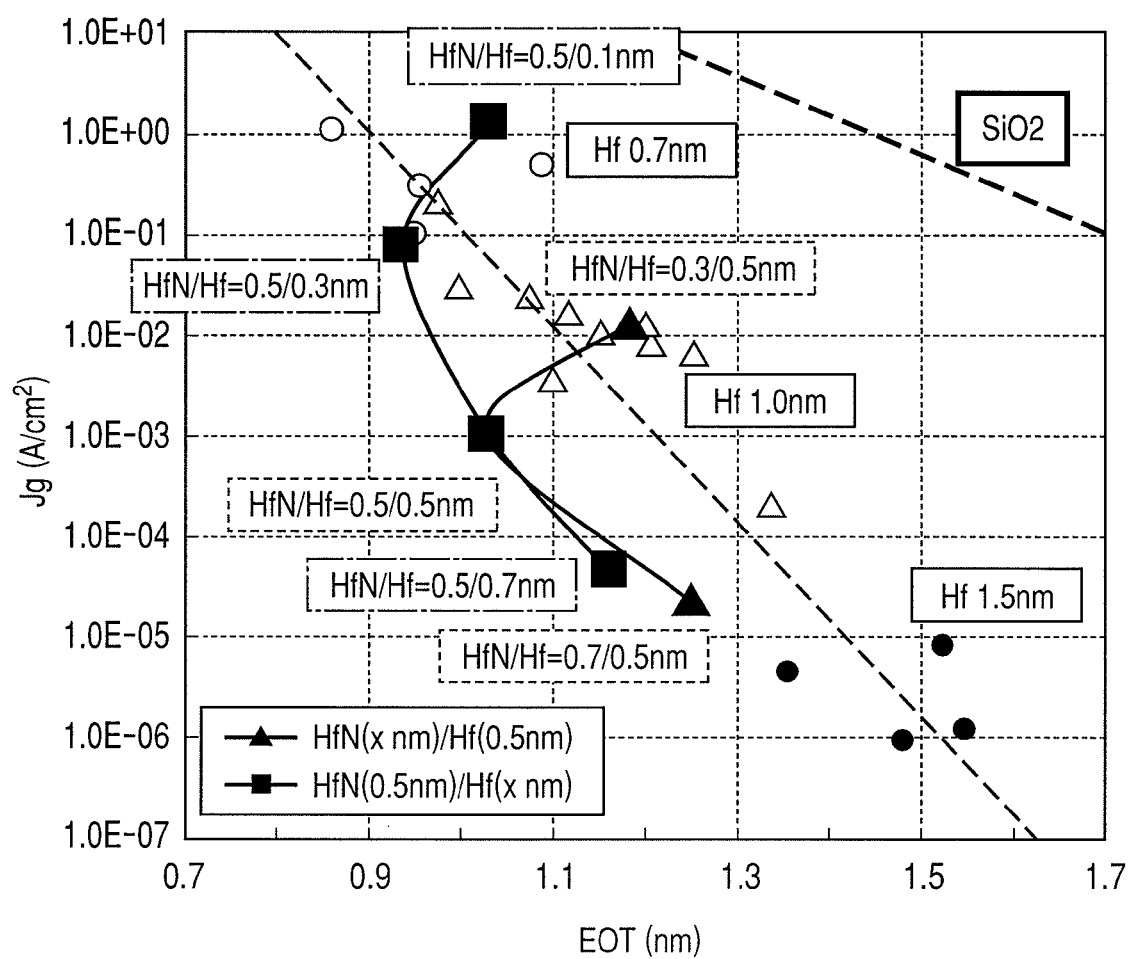
FIG. 10 is a diagram illustrating the dependence of the EOT and the leak current (Jg) of a dielectric film on the thickness of an HfN/Hf film according to an embodiment of the present invention.

Next, a relationship between the EOT and the leak current of a film is illustrated in FIG. 10 (■ marks in the figure), which film is manufactured by setting the mole ratio N/(Hf+N) of the HfN film to 0.09, fixing the HfN film thickness to 0.5 nm, and varying the thickness of the Hf film to be laminated in the range of 0.1 nm to 0.7 nm. From FIG. 10, it is observed that the EOT is improved in the range of 0.3 nm to 0.7 nm of the Hf film thickness. However, when the Hf film thickness is 0.1 nm, the EOT becomes larger than when the Hf film thickness is 0.3 nm and the leak current value Jg is degraded as large as $1.0 \text{ E} \times 10^{-1}$ A/cm$^2$ or more. This result indicates the presence of the optimum film thickness in the thickness of the Hf film to be deposited on the HfN film. When the Hf film thickness is reduced to less than 0.3 nm, oxygen at the time of heat treatment causes an increase in the thickness of the silicon oxide film. Further, when the Hf film thickness exceeds 1.0 nm, the unreacted metal Hf that has not oxidized completely remains after the heat treatment and the leak current value increases. Consequently, it is recommended to set the thickness of the metal film made of Hf to the range from 0.3 nm to 1.0 nm inclusive in order to realize EOT=1.5 nm or less in the step of forming a dielectric film using the laminated film of HfN and Hf in the present embodiment.

Figure 11A:
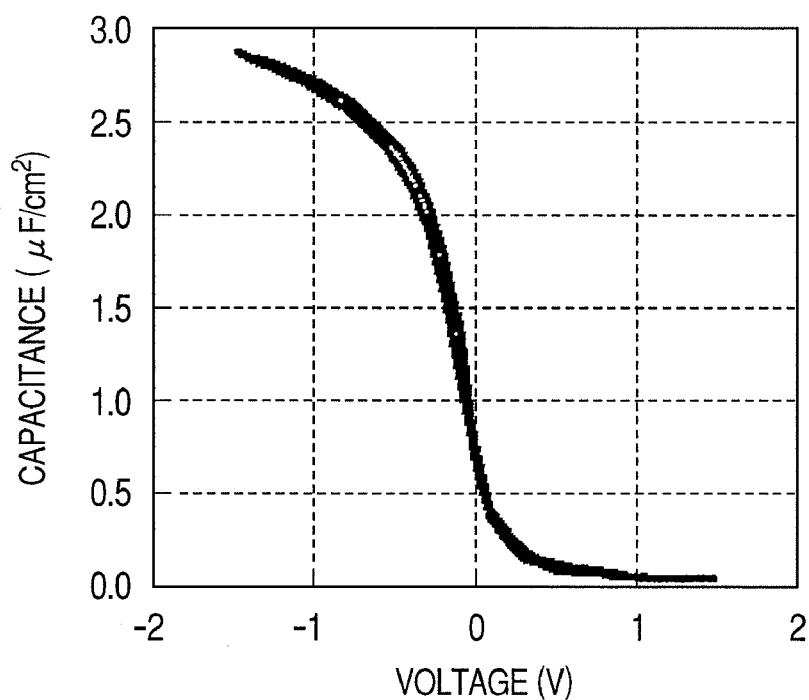
FIG. 11A is a diagram illustrating a C-V curve of a dielectric film in the case of $SiO_2$/HfN (1.0 nm) according to an embodiment of the present invention.
Figure 11B:
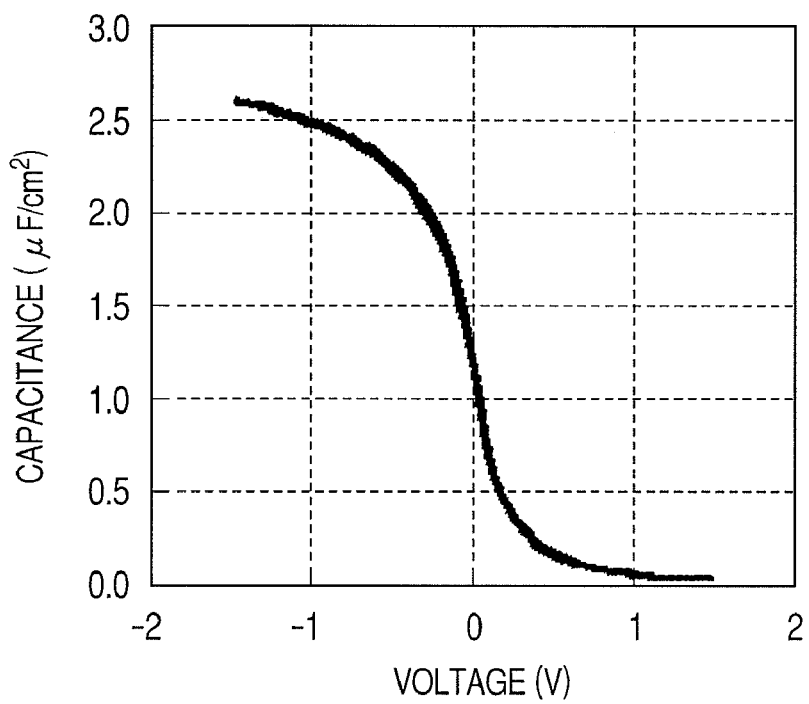
FIG. 11B is a diagram illustrating a C-V curve of a dielectric film in the case of $SiO_2$/HfN/Hf (0.5 nm/0.5 nm) according to an embodiment of the present invention.

Next, FIG. 11A is a diagram illustrating the C-V characteristic of a sample, in which the mole ratio N/(Hf+N) of the HfN film is set to 0.09 and the HfN film thickness is fixed to 1.0 nm. FIG. 11B is a diagram illustrating the C-V characteristic of a sample, in which the mole ratio N/(Hf+N) of the HfN film is set to 0.09 and the HfN film having a thickness of 0.5 nm and the Hf film having a thickness of 0.5 nm are laminated. As illustrated in FIG. 11B, no hysteresis is observed in the HfN/Hf laminated film although the hysteresis shift of 40 mV is observed in the HfN single layer film as illustrated in FIG. 11A. This result indicates that the HfN/Hf laminated film can reduce more fixed charges in the insulating film. Consequently, it is demonstrated that the concentration of nitrogen diffused into the silicon oxide film is optimized in the laminated film of HfN and Hf in the present embodiment and the effect to further reduce fixed charges is obtained.

Figure 12:
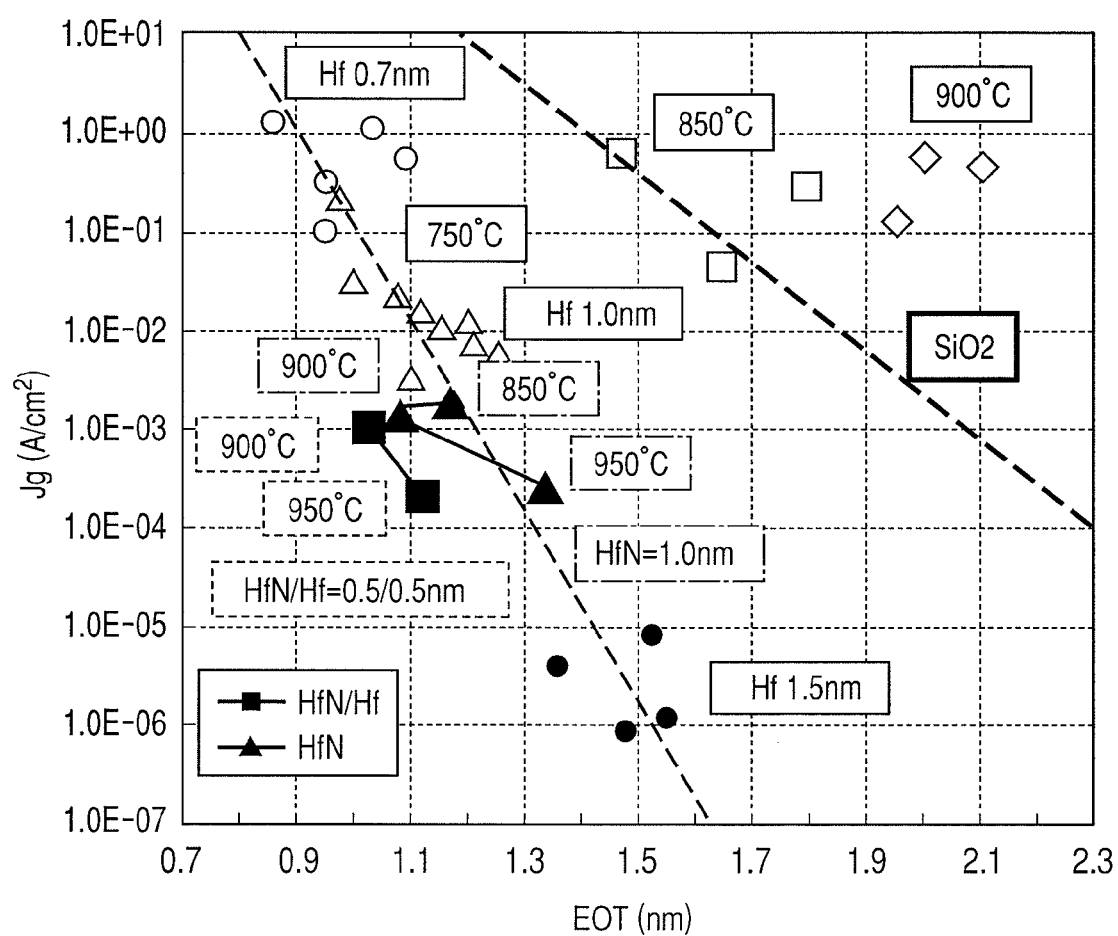
FIG. 12 is a diagram illustrating the dependence of the EOT and the leak current (Jg) of a dielectric film on the anneal temperature according to an embodiment of the present invention.

Next, as to a sample, in which the mole ratio N/(Hf+N) of the HfN film is set to 0.09 and the HfN single layer film is deposited on the silicon oxide under film to a thickness of 1.0 nm and a sample, in which the HfN film having a thickness of 0.5 nm and the Hf film having a thickness of 0.5 nm are laminated, the result of the evaluation of the dependence of the anneal temperature in an oxygen atmosphere is illustrated in FIG. 12. Further, the characteristics of a sample, in which the film thickness of the Hf single layer film is varied in the range of 0.7 to 1.5 nm, is illustrated in the figure for comparison. When the Hf single layer film is deposited to a thickness of 1.0 nm and subjected to the heat treatment at 750° C., an increase in EOT is not observed (Δ marks in the figure), however, when the heat treatment temperatures are 850° C. (□ marks in the figure) and 900° C. (◇ marks in the figure), an increase in EOT can be observed. This indicates that with the method described in the specification of Japanese Patent No. 4239015 in which the Hf single layer film is deposited on the silicon oxide film and subjected to the heat treatment, if the thickness of the silicon oxide film is reduced, the thickness of the silicon oxide under film is increased because of the heat treatment to perform Hf diffusion. Hence, with this method, it is difficult to form an insulating film having high heat resistance in the region where the EOT is 1.5 nm or less.

In the HfN single layer film, when the anneal temperature is increased to 950° C., an increase in EOT is observed, however, in the HfN/Hf laminated film, even if the anneal temperature is increased to 950° C., an increase in EOT is not observed. Consequently, it is demonstrated that the EOT is reduced, the leak current value is reduced, and the heat resistance is improved in the dielectric film formed by the laminated film of HfN and Hf in the present embodiment.

In the fourth step S104 in the present invention, it is recommended to perform heat treatment at 700° C. or more in order to obtain heat resistance for the activation step in the CMOS manufacturing step and 850° C. or more is more recommended. It is desirable for the partial pressure of oxygen during the period of heat treatment in the fourth step 104 to be 0.001 Pa or more to prevent the unreacted metal Hf that has not been oxidized completely from remaining and for the partial pressure to be set to 10 Pa or less to prevent excessive oxidation.

Figure 13A:
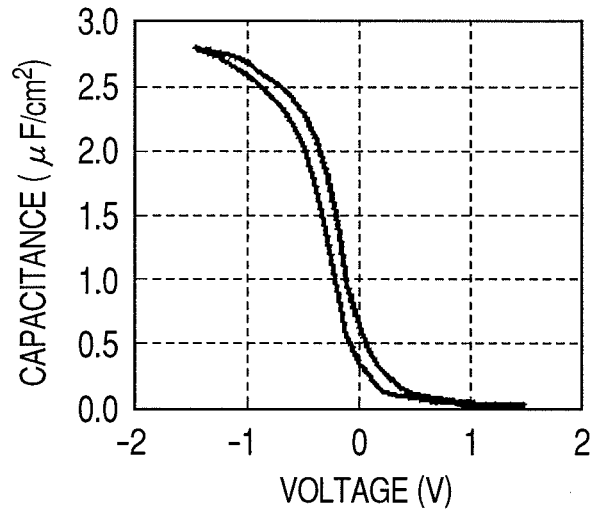
FIG. 13A is a diagram illustrating a C-V curve of a dielectric film without heat treatment according to an embodiment of the present invention.
Figure 13B:
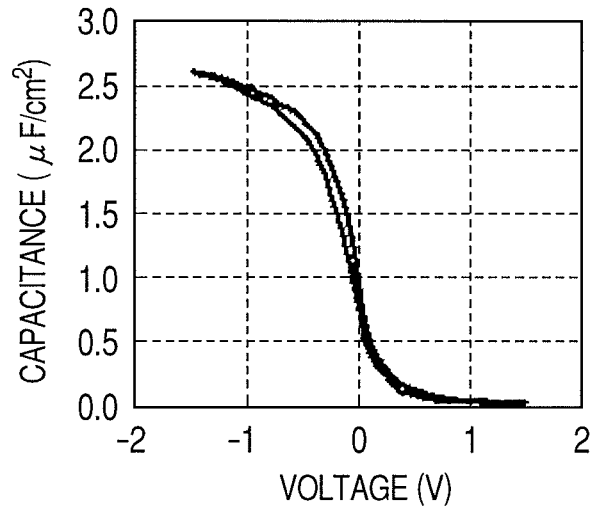
FIG. 13B is a diagram illustrating a C-V curve of a dielectric film when a heat treatment at 650° C. is performed according to an embodiment of the present invention.
Figure 13C:
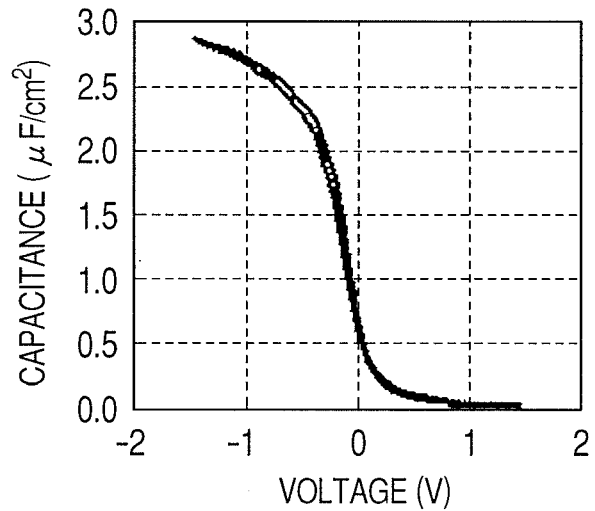
FIG. 13C is a diagram illustrating a C-V curve of a dielectric film when a heat treatment at 900° C. is performed according to an embodiment of the present invention.

Next, the result of the examination of the influence of the heat treatment temperature in first step S101 on hysteresis will be described. First, a case is described, where a heat treatment is performed on the substrate 201 on which the silicon native oxide film is left over without the Wet treatment to form the silicon oxide under film 202 in the first step S101 in the present embodiment. When the silicon substrate is exposed to the atmosphere, a native oxide film is formed. The results are illustrated in FIGS. 13A to 13C, when the substrate 201 having the native oxide film is heat-treated in a vacuum, and the flow rate of nitrogen is set to 1.5 sccm, which is the optimum flow rate of nitrogen obtained from FIG. 7, and the mole ratio N/(Hf+N) is set to 0.09, and then, the HfN film is deposited to a thickness of 1.0 nm and heat-treated at 900° C. FIG. 13A is a diagram illustrating the C-V characteristic of a dielectric when heat treatment is not performed in the step S101d, FIG. 13B is a diagram illustrating the C-V characteristic of a dielectric heat-treated at 650° C. in the step S101d, and FIG. 13C is a diagram illustrating the C-V characteristic of a dielectric heat-treated at 900° C. in the step S101d.

As illustrated in FIG. 13A, when heat treatment is not performed, there is a hysteresis of 110 mV, however, when heat treatment at 650° C. in FIG. 13B is performed, the hysteresis reduces to 70 mV. Further, in the case of the heat treatment at 900° C. in FIG. 13C, the hysteresis further reduces to 40 mV. That is, when the heat treatment temperature in the step S101d is raised, a decrease in hysteresis is observed. The reason for this result can be thought that the native oxide film is formed by moisture in the atmosphere, and therefore, if heat treatment is performed in a vacuum and the heat treatment temperature is further raised, the fixed charges in the silicon oxide film formed after the heat treatment are suppressed and thus the hysteresis reduces.

It is recommended to perform heat treatment at 500° C. or more in order to sufficiently remove moisture in the native oxide film in the step S101d in the first step S101 of forming a silicon oxide film by heat-treating a native oxide film in the present embodiment. Further, it is recommended to set the pressure in the vacuum vessel during the period of heat treatment in the first step S101 to $1\times10^{-2}$ Pa or less in order to suppress re-oxidation and adsorption of impurities during the period of heat treatment. The hysteresis improvement effect obtained by raising the heat treatment temperature in the first step S101d can also be obtained by performing the DHF treatment (step S101a) and dry etching treatment (step S101f) and after removing the native oxide film, performing heat treatment at 700° C. or more (steps S101b, 101f) in an atmosphere of a partial pressure of oxygen of $1\times10$ Pa or less.

It is desirable for the upper limit of the heat treatment temperature in the first step S101 to be 1,000° C. or less from the viewpoint of controlling the film thickness of the silicon oxide film 202 to 1 nm or less.

The effect of the present invention can also be obtained in the MIS structure using TiN as an upper electrode. When TiN is used as the upper electrode, it is recommended to transfer a substrate from a vacuum vessel in which a dielectric film is formed to another vacuum vessel via a vacuum transfer vessel without exposing the substrate to the atmosphere and form a film in order to suppress the electric characteristics from degrading due to the carbon contamination accompanying the exposure of the dielectric film to the atmosphere.

In the above description, the manufacturing method of a dielectric film by a laminated film using HfN in the second step S102 and Hf in the third step S103 is described, however, this is not limited, and the effect of the present embodiment can be obtained satisfactorily if a metal nitride film containing Hf and N that satisfies the condition of the present embodiment is formed in the second step S102 and a metal film containing Hf that satisfies the condition of the present embodiment is formed in the third step S103.

In the above description, the case where a dielectric film is formed on a silicon oxide film is described, however, the effect can also be obtained satisfactorily by applying the method of the present embodiment to part of a MOS transistor.

That is, the method of the present embodiment can be applied to a method of manufacturing a semiconductor device having a dielectric film as an insulating film, and for example, the following manufacturing methods can be cited.

A first example is a method of manufacturing a semiconductor device having a substrate at least the surface of which is a semiconductor layer, a gate electrode formed on the substrate, and a laminated gate insulating film sequentially laminated between the substrate and the gate electrode, wherein at least one layer of the insulating film included in the laminated gate insulating film is formed by the method of the present embodiment.

A second example is a method of manufacturing a non-volatile semiconductor device having a substrate at least the surface of which is a semiconductor device, a gate electrode formed on the substrate, and a structure in which an insulating film, a floating electrode, and an insulating film are sequentially laminated between the substrate and the gate electrode, wherein at least part of the insulating film formed between the gate electrode and the floating electrode is a dielectric film of the present invention.

A third example is a method of manufacturing a semiconductor device having a source region, a drain region, and a gate electrode formed via an insulating film on a substrate at least the surface of which is a semiconductor layer, wherein the insulating film is formed by the method of the present invention.

<First Embodiment>

A first embodiment of the present invention will be described in detail with reference to the drawings.

FIG. 2 is a diagram illustrating a MIS capacitor having a dielectric film formed by the method of the present embodiment. By performing vacuum anneal on the silicon substrate 201 having a native oxide film on the surface, impurities, such as moisture and carbon, adsorbed onto the surface, are removed and a very thin silicon oxide under film is formed on the silicon substrate 201. Next, an HfN film is deposited by the sputtering method. As a target, a metal target of Hf is used and as a sputter gas, argon and nitrogen are used.

It is possible to appropriately determine the substrate temperature in the range of 27° C. to 600° C., the target power in the range of 50 W to 1,000 W, the sputter gas pressure in the range of 0.02 Pa to 0.1 Pa, the gas flow rate of Ar in the range of 1 sccm to 200 sccm, the gas flow rate of oxygen in the range of 1 sccm to 100 sccm, and the gas flow rate of nitrogen in the range of 1 sccm to 50 sccm.

Here, a film is formed when the substrate temperature is 30° C., the target power of Hf 100 W, the sputter gas pressure 0.03 Pa, the gas flow rate of Ar 50 sccm, and the gas flow rate of nitrogen 1.0 to 2.0 sccm. The feed rate of nitrogen is set so that the mole ratio N/(Hf+N) illustrated in FIG. 5 is in the range of 0.04 to 0.11 in order to deposit the HfN film.

The HfN film is formed to a thickness in the range of 0.3 nm to 0.7 nm using the forming step described above.

Next, the Hf film is formed successively to a thickness in the range of 0.3 nm to 0.7 nm in one and the same sputter device and the Hf film is also formed to a thickness of 0.1 nm for comparison. Here, the film is formed when the substrate temperature is 30° C., the target power of Hf 100 W, the sputter gas pressure 0.03 Pa, and the gas flow rate of Ar 50 sccm.

Next, the anneal treatment of the HfN/Hf laminated film is performed in an oxygen atmosphere. It is possible to appropriately determine the substrate temperature in the range of 300° C. to 1,000° C., the pressure in the range of 0.001 Pa to 10 Pa, and the gas flow rate of oxygen in the range of 1 sccm to 200 sccm. By the anneal treatment, the dielectric film 206 is formed.

Next, the TiN upper electrode 205 is formed by the sputtering method. As a target, the metal target of Hf is used and as a sputter gas, argon and nitrogen are used.

It is possible to appropriately determine the substrate temperature in the range of 27° C. to 600° C., the target power in the range of 50 W to 1,000 W, the sputter gas pressure in the range of 0.02 Pa to 0.1 Pa, the gas flow rate of Ar in the range of 1 sccm to 200 sccm, and the gas flow rate of nitrogen in the range of 1 sccm to 50 sccm.

Here, the film is formed when the substrate temperature is 30° C., the target power of Ti 750 W, the sputter gas pressure 0.03 Pa, the gas flow rate of Ar sccm, and the gas flow rate of nitrogen 10 sccm. By using this step, the TiN film is deposited to a thickness of 20 nm.

Next, the electrode metal film TiN is processed into a desired size using the lithography technique and the RIE technique and the MIS capacitor structure is formed. Here, the electrode may be made of Au.

Figure 14:
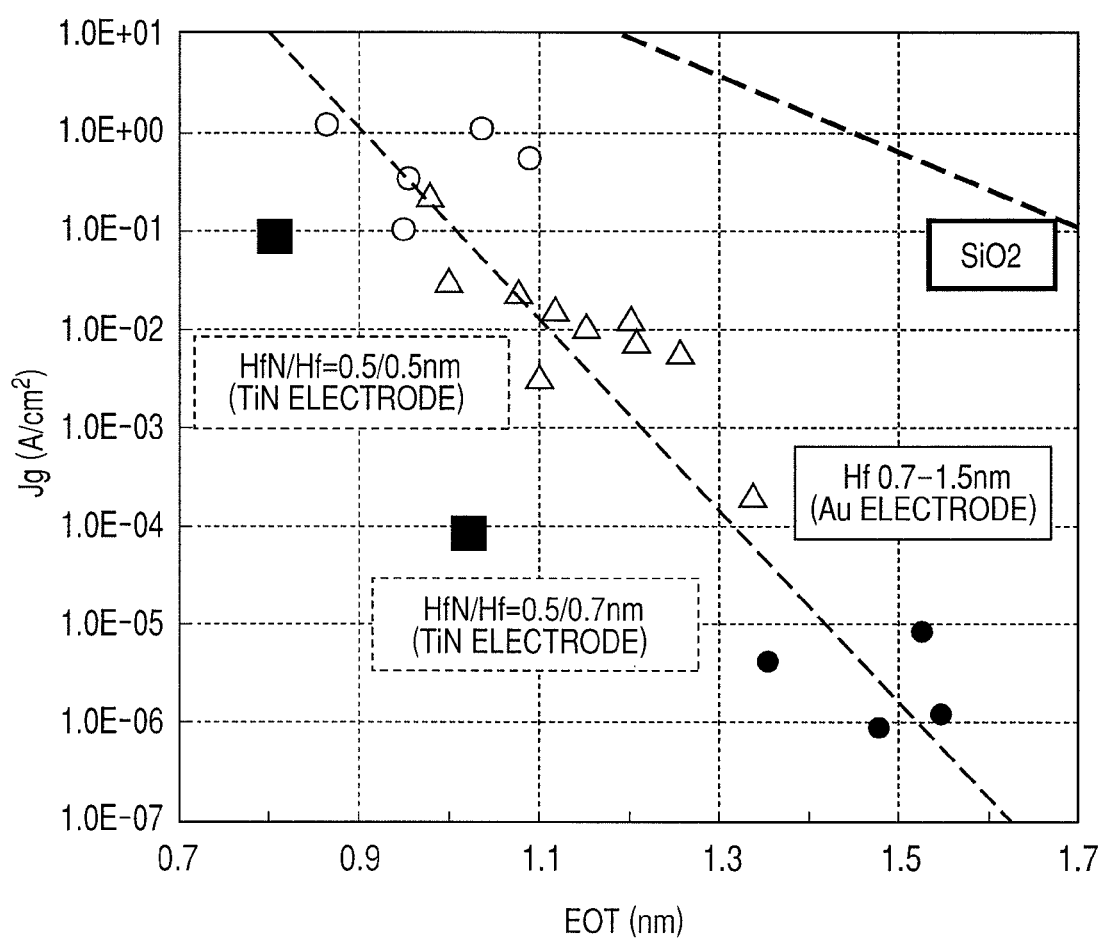
FIG. 14 is a diagram illustrating a relationship between the EOT and the leak current (Jg) of a dielectric film obtained by an embodiment of the present invention.

The C-V and I-V characteristics of the dielectric film 206 manufactured as described above are evaluated. The result is illustrated in FIG. 14. Even when the TiN electrode is used, it is possible to obtain the characteristics of EOT=1.5 nm or less and the leak current $Jg=1.0\times10^{-1}$ $A/cm^2$ or less by using the HfN/Hf laminated film. The EOT reduces most when the mole ratio N/(Hf+N) of the HfN film is in the range of 0.04 to 0.11 or less. Further, when the HfN film is laminated to a thickness of 0.3 nm to 0.7 nm and the Hf film to a thickness of 0.3 nm to 1.0 nm, the EOT reduces more than the HfN film and a dielectric film more excellent in heat resistance can be formed.

Figure 15:
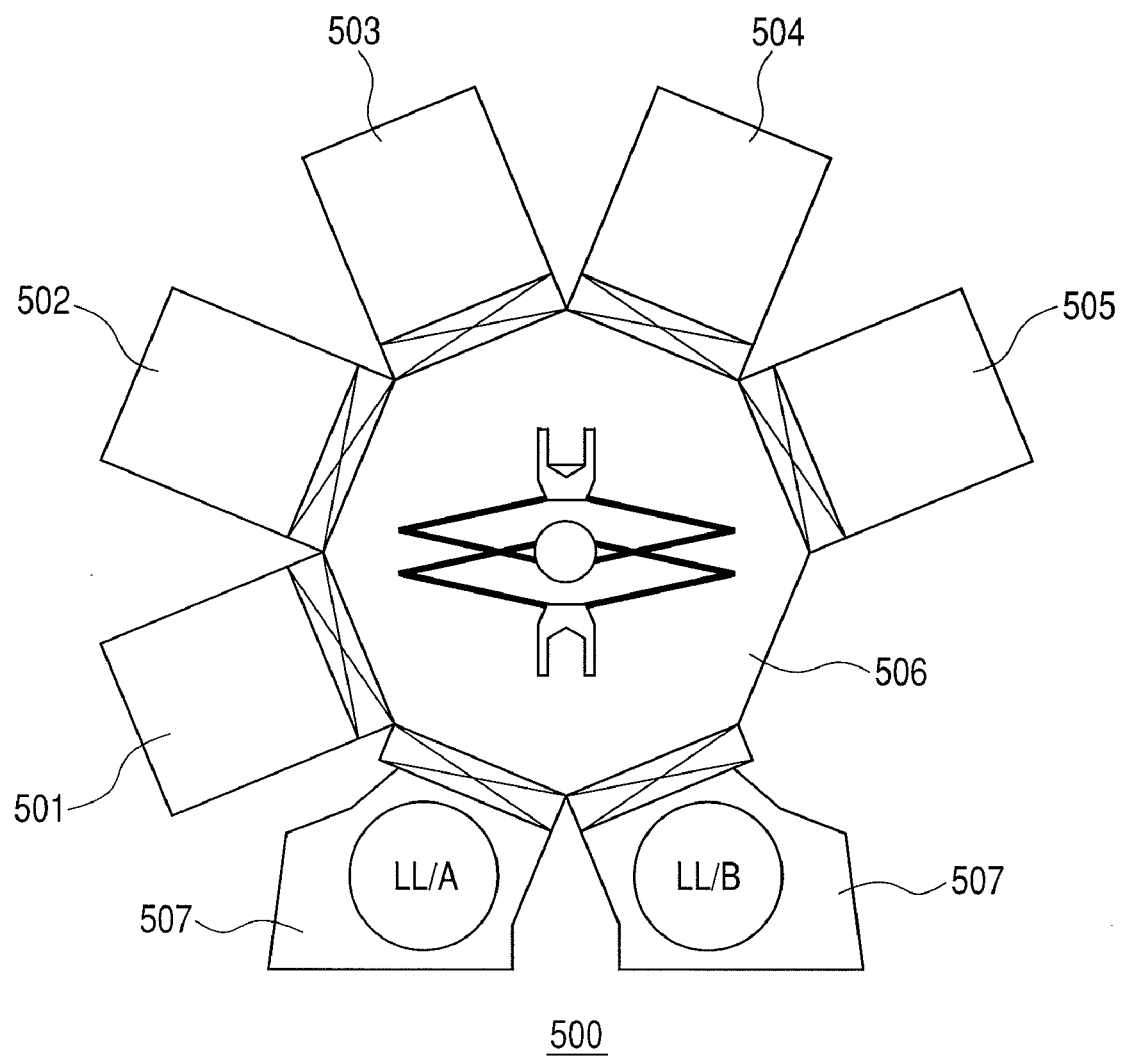
FIG. 15 is a diagram illustrating a configuration of a semiconductor device used in an embodiment of the present invention.

FIG. 15 illustrates a semiconductor manufacturing apparatus 500 used in a method of manufacturing a semiconductor device using a dielectric film of the embodiment of the present invention. The semiconductor manufacturing apparatus 500 comprises a dry etching device 501, a first vacuum heat treatment device 502 to perform the first step S101, a first magnetron sputter device 503 to perform the second step S102 and the third step S103, a second vacuum heat treatment device 504 to perform the fourth step S104, a second magnetron sputter device 505 to form a TiN electrode, a vacuum transfer device 506 capable of transferring a substrate to each of the devices of reference numerals 501 to 505 without exposing the substrate to the atmosphere, and a substrate introduction device 507 to transfer a substrate from the atmosphere into a vacuum. The dry etching device 501 is a device to remove a native oxide film. By using the semiconductor manufacturing apparatus 500, it is possible to successively perform treatment without exposing a substrate to the atmosphere, and therefore, impurities, such as moisture, carbon, and oxygen, can be suppressed from being adsorbed by the interface. Hence, it is possible to transfer a substrate to the next step without changing the characteristics of a film formed in each device.

The semiconductor manufacturing apparatus 500 comprises a controller (not shown schematically) including a processing unit, such as a CPU, and executes predetermined treatment (the first to fourth steps and the film formation treatment of the upper electrode illustrated in FIG. 1 in the present embodiment) on a to-be-treated substrate by outputting an instruction signal to each of the treatment devices 501 to 507 according to a predetermined program. Each of the treatment devices 501 to 507 comprises a controller (not shown schematically), such as a PLC (programmable logic controller), and controls devices, such as a mass flow controller and an exhaust pump, according to an instruction signal output from the controller.

<Second Embodiment (embodiment applied to gate insulating film)>

A second embodiment of the present invention will be described in detail with reference to the drawings.

Figure 16:
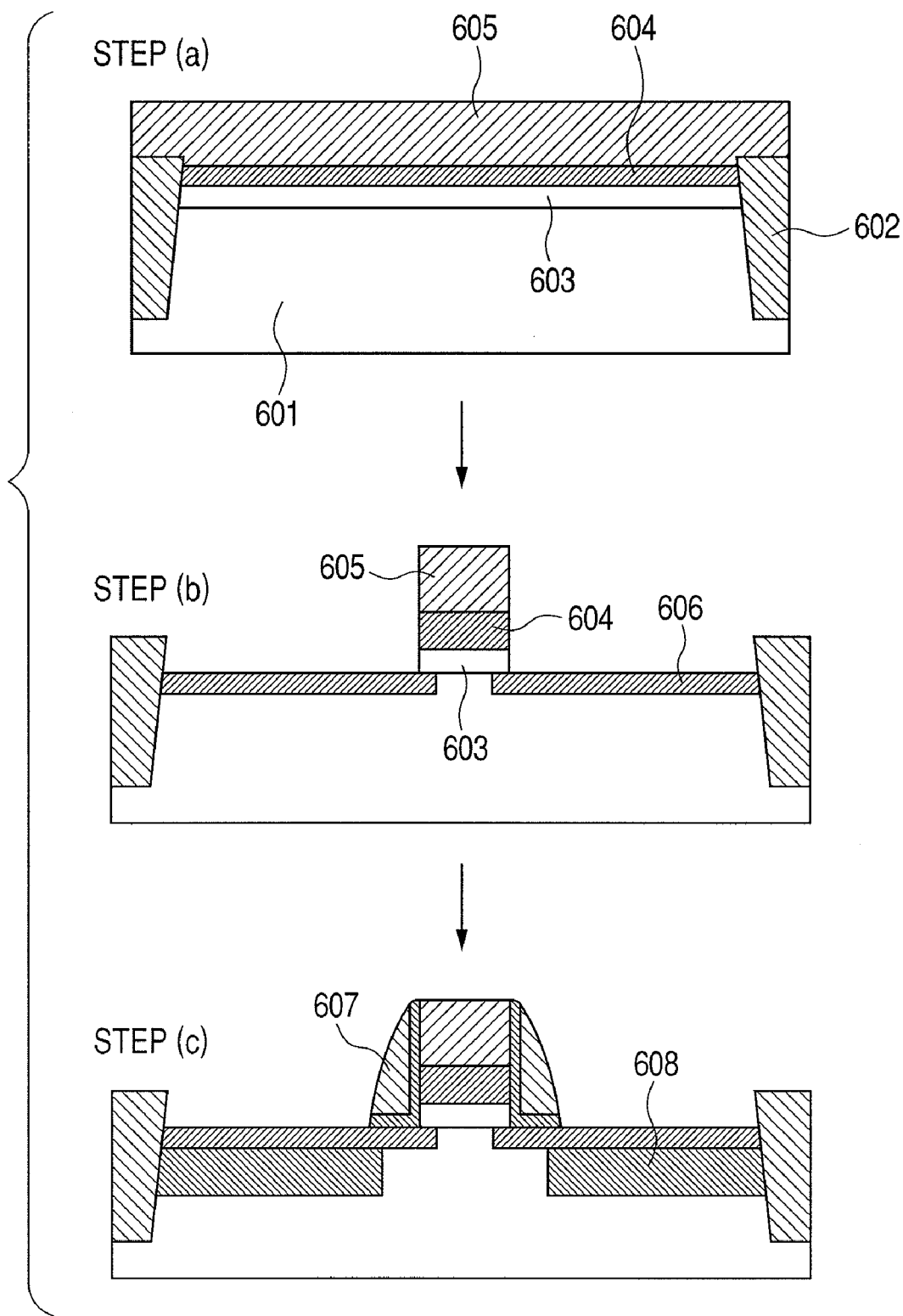
FIG. 16 is a diagram illustrating a process of a method of manufacturing a semiconductor device in an embodiment of the present invention.

Steps (a) to (c) in FIG. 16 illustrate steps of a method of manufacturing a semiconductor device using a dielectric film of the second embodiment of the present invention.

First, as illustrated in the step (a) in FIG. 16, an element isolation region 602 is formed on the surface of a silicon substrate 601 using the STI (Shallow Trench Isolation) technique. Following this, a silicon oxide film 603 is formed on the surface of the isolated silicon substrate 601 by any one of the three kinds of method in the first step S101 described in FIG. 1. Subsequently, an HfN/Hf laminated film is formed by the method described in the above-mentioned embodiment. Subsequently, heat treatment is performed and a dielectric film 604 is obtained.

Next, after forming a Poly-Si film 605 having a thickness of 150 nm on the dielectric film 604, a lamination of the silicon oxide film 603, the dielectric film 604, and the Poly-Si film 605 is processed into a gate electrode using the lithography technique and the RIE technique as illustrated in the step (b) in FIG. 16. Subsequently, ions are implanted and an extension region 606 is formed using the gate electrode as a mask in a self-alignment manner.

Here, the gate electrode of a Poly-Si film is used, however, a MIPS in which a metal electrode, such as TiN, is inserted between a Poly-Si film and a dielectric film, may be used as a gate electrode, and further, the entire gate electrode may be made of a metal material.

Further, as illustrated in the step (c) in FIG. 16, a silicon nitride film and a silicon oxide film are deposited sequentially and then a gate sidewall 607 is formed by performing etch back. In this state, ions are implanted again and a source/drain region 608 is formed through activation anneal.

According to the result of the evaluation of the electric characteristics of the manufactured semiconductor device, it has been confirmed that the dielectric constant increases in a dielectric film containing Hf, Si, O and N, that is, the dielectric film 604 compared to $HfO_2$ not containing N, and the EOT and the leak current can be reduced.

As described above, according to the present embodiment, it is possible to reduce the EOT and the gate leak current and to obtain a semiconductor device further excellent in heat resistance by performing the method of manufacturing a dielectric film in an embodiment of the present invention in a method of manufacturing a semiconductor device having a dielectric film containing Hf, Si, O and N in part of a gate insulating film of a MOSFET.

What is claimed is:

1. A method of manufacturing a dielectric film comprising:
a first step of preparing a to-be-treated substrate on which a silicon oxide film is formed;
a second step of depositing a metal nitride film containing Hf and N on the silicon oxide film;
a third step of depositing a metal film containing Hf on the metal nitride film; and
a fourth step of performing a heat treatment on a laminated film of the silicon oxide film, the metal nitride film, and the metal film to form a metal oxynitride containing Hf, Si, O and N.

2. The method of manufacturing a dielectric film according to claim 1, wherein in the second step, the metal nitride film is formed so that its film thickness from 0.3 nm to 0.7 nm.

3. The method of manufacturing a dielectric film according to claim 1, wherein in the second step, the metal nitride film is formed so that a mole ratio N/(Hf+N) of the metal nitride film is from 0.04 to 0.11.

4. The method of manufacturing a dielectric film according to claim 1, wherein in the third step, the metal film is formed so that a film thickness of the metal film is from 0.3 nm to 1.0 nm.

5. The method of manufacturing a dielectric film according to claim 1, wherein in the fourth step, a heat treatment at 700° C. or more is performed on the deposited metal nitride film to cause the metal nitride film to silicate-react with the silicon oxide film.

6. The method of manufacturing a dielectric film according to claim 5, wherein in the fourth step, a partial pressure of oxygen during a period of the heat treatment is set to 10 Pa or less.

7. The method of manufacturing a dielectric film according to claim 1, wherein the first step is a step of oxidizing a surface of the to-be-treated substrate of a silicon substrate by heating, to form the silicon oxide film on the to-be-treated substrate.

8. The method of manufacturing a dielectric film according claim 7, wherein in the first step, the heat treatment is performed on the to-be-treated substrate from which a silicon native oxide film is removed by a wet treatment or dry etching treatment, to form the silicon oxide film on the to-be-treated substrate.

9. The method of manufacturing a dielectric film according to claim 8, wherein in the first step, the heat treatment is performed at 700° C. or more on the to-be-treated substrate from which the silicon native oxide film has been removed, to form the silicon oxide film on the to-be-treated substrate.

10. The method of manufacturing a dielectric film according to claim 7, wherein in the first step, the heat treatment is performed on the to-be-treated substrate having a silicon native oxide film, to form the silicon oxide film on the to-be-treated substrate.

11. The method of manufacturing a dielectric film according to claim 10, wherein in the first step, the heat treatment is performed at 500° C. or more on the to-be-treated substrate having the silicon native oxide film on the surface thereof, to form the silicon oxide film on the to-be-treated substrate.

12. The method of manufacturing a dielectric film according to claim 11, wherein in the first step, a pressure in a vacuum vessel in a heat treatment atmosphere is set to $1 \times 10^{-2}$ Pa or less.

13. The method of manufacturing a dielectric film according to claim 1, wherein the second step is a step of magnetron-sputtering a metal target made of a metal nitride contained in the metal nitride film in a mixed atmosphere of a reactive gas containing nitrogen and an inert gas in a vacuum vessel, wherein a feed rate of the reactive gas is set so that a mole ratio N/(Hf+N) of the metal nitride is from 0.04 to 0.11.

14. The method of manufacturing a dielectric film according to claim 13, wherein pressures in the vacuum vessel in the second step and in the third step are $1 \times 10^{-1}$ Pa or less.

15. The method of manufacturing a dielectric film according to claim 1, wherein the second step is a step of magnetron-sputtering a metal target made of a metal nitride contained in the metal nitride film in a mixed atmosphere of a reactive gas containing nitrogen and an inert gas in a vacuum vessel, wherein a feed rate of the reactive gas is set so that a mole ratio N/(Hf+N) of the metal nitride is from 0.04 to 0.11 and the metal nitride film is formed so that a thickness of the metal nitride film is from 0.3 nm to 0.7 nm, and wherein the third step is a step of magnetron-sputtering a metal target made of a metal contained in the metal film in an atmosphere of an inert gas in a vacuum vessel, wherein the metal film is formed so that a thickness of the metal film is from 0.3 nm to 1.0 nm.

16. The method of manufacturing a dielectric film according to claim 15, wherein the second step and the third step are performed in one and the same vacuum vessel.

17. A method of manufacturing a semiconductor device having a dielectric film as an insulating film, wherein the dielectric film is formed by the method according to claim 1.

18. A method of manufacturing a semiconductor device having:
a substrate at least the surface of which is a semiconductor layer;
a gate electrode formed on the substrate; and
a laminated gate insulating film laminated sequentially between the substrate and the gate electrode,
wherein at least one layer of an insulating film included in the laminated gate insulating film is formed by the method according to claim 1.

19. The method of manufacturing a semiconductor device according to claim 18, wherein a gate electrode formed on the insulating film is TiN,
wherein the step of forming the gate electrode is a step of magnetron-sputtering a titanium metal target in a mixed atmosphere of a reactive gas made of a mixture gas of argon and nitrogen, and an inert gas, and
wherein a substrate is transferred from a vacuum vessel in which the insulating film is formed to another vacuum vessel via a vacuum transfer vessel and the gate electrode is formed in the another vacuum vessel.

20. A method of manufacturing a semiconductor device having:
a source region;
a drain region; and
a gate electrode formed via an insulating film, on a substrate at least a surface of which is a semiconductor layer,
wherein the insulating film is formed by the method according to claim 1.

21. A method of manufacturing a dielectric film comprising:
a first step of preparing a to-be-treated substrate on which a silicon oxide film is formed;
a second step of depositing a metal nitride film containing Hf and N on the silicon oxide film;
a third step of depositing a metal film containing Hf on the metal nitride film; and
a fourth step of performing a heat treatment on a laminated film of the silicon oxide film, the metal nitride film deposited on the silicon oxide film, and the metal film deposited on the metal nitride film to form a metal oxynitride containing Hf, Si, O and N,
wherein a heat treatment at 700° C. or more is performed on the deposited metal nitride film to oxidize the metal film to form HfO and to cause the metal nitride film to silicate-react with the silicon oxide film to form a laminated film of SiON and HfON, and thereby form the metal oxynitride having the HfO, the SiON, and the HfON.

* * * * *